United States Patent

Harada et al.

[11] Patent Number: 5,909,354
[45] Date of Patent: Jun. 1, 1999

[54] ELECTROSTATIC CHUCK MEMBER HAVING AN ALUMINA-TITANIA SPRAY COATED LAYER AND A METHOD OF PRODUCING THE SAME

[75] Inventors: Yoshio Harada; Junichi Takeuchi, both of Hyogo, Japan

[73] Assignee: Tocalo Co., Ltd., Hyogo, Japan

[21] Appl. No.: 08/694,453

[22] Filed: Aug. 12, 1996

[30] Foreign Application Priority Data

Aug. 31, 1995 [JP] Japan ................................... 7-223149

[51] Int. Cl.[6] ................................................. H02N 13/00
[52] U.S. Cl. ............................................ 361/234; 279/128
[58] Field of Search ..................................... 361/230, 231, 361/232, 234, 233, 235; 279/128; 427/446, 453

[56] References Cited

U.S. PATENT DOCUMENTS

| | | | |
|---|---|---|---|
| 5,350,479 | 9/1994 | Collins et al. | 361/234 |
| 5,384,682 | 1/1995 | Watanage et al. | 361/234 |
| 5,612,144 | 3/1997 | Shinohara et al. | 361/230 |

FOREIGN PATENT DOCUMENTS

| | | |
|---|---|---|
| 62-94953 | 5/1987 | Japan . |
| 2206147 | 8/1990 | Japan . |
| 3147843 | 6/1991 | Japan . |
| 3204924 | 9/1991 | Japan . |
| 4304942 | 10/1992 | Japan . |
| 5235152 | 9/1993 | Japan . |
| 6-8089 | 1/1994 | Japan . |
| 6-36583(B2) | 5/1994 | Japan . |
| 6302677 | 10/1994 | Japan . |

OTHER PUBLICATIONS

Ohmori et al., Electrical conductivity of plasma–sprayed titanium oxide coatings, Thin Solid Films, vol. 201, issue 1, pp. 1–8, Japan. See attached chemical abstract, 1991.
English Language Abstract of–JP–6–8089.
English Language Abstract of–JP–6302677.
English Language Abstract of–JP–6–36583.
English Language Abstract of–JP–1–253375.
English Language Abstract of–JP–4–304942.
English Language Abstract of–JP–5–235152.
English Language Abstract of–JP–62–94953.
English Language Abstract of–JP–2–206147.
English Language Abstract of–JP–3–204924.

*Primary Examiner*—Fritz Fleming
*Attorney, Agent, or Firm*—Greenblum & Bernstein, P.L.C.

[57] ABSTRACT

An electrostatic chuck member includes a metal substrate, an undercoat of a metallic spray-coated layer and a topcoat of $Al_2O_3TiO_2$ based spray-coated layer containing a $Ti_nO_{2n-1}$, where n=1–9, compound. The electrostatic chuck member has a large volume resistivity, a small scattering, and the quality is stable. A method for making the electrostatic chuck member includes subjecting a metal substrate to a blast treatment, spray-coating a metallic undercoat on a surface of the metal substrate, and spray-coating $Al_2O_3\ TiO_2$ on to the metallic undercoat to form a $Al_2O_3\text{-}TiO_2$ based layer in which at least a portion of the $TiO_2$ is changed into $Ti_nO_2$, where n=1–9.

20 Claims, 2 Drawing Sheets

ELECTROSTATIC CHUCK MEMBER HAVING AN ALUMINA-TITANIA SPRAY COATED LAYER AND A METHOD OF PRODUCING THE SAME

BACKGROUND OF THE INVENTION

1. Field of the Invention

This invention relates to electrostatic chuck members and a method of producing the same. The electrostatic chuck members are used when a conductive member, semi-conductive member, insulative member or the like is held at adsorption state by static electricity and particularly incorporated into a dry etching device, an ion implantation device, a CVD device or a PVD device used in the production process of large size integrations or liquid crystals display.

2. Description of Related Art

Recently, treatments such as dry etching, ion implantation, CVD, PVD and the like constituting a part of a production process for the large size integrations or liquid crystals display, e.g. a production device of semiconductors changes from a wet process into a dry process from viewpoints of automation and anti-pollution. A greater part of the treatment through the dry process is usually carried out under vacuum.

In the dry treatment, it becomes recently important to improve a positioning accuracy in the formation of pattern on silicon wafer, glass plate or the like, for example, used as a substrate from viewpoints of high integration of circuits and fine work.

In order to satisfy such a demand, vacuum chuck or mechanical chuck has hitherto been adopted in the transportation, adsorption and fixation of the substrate. However, since the vacuum chuck is used under vacuum, the pressure difference is small and the adsorption effect is less. Even if the substrate can be adsorbed, an adsorbing portion becomes local and strain is caused in the substrate. Furthermore, the gas cooling can not be carried out with the temperature rising in the treatment of the wafer, so that the vacuum chuck can not be applied to the recent production process of high-performance semiconductor devices. On the other hand, the mechanical chuck becomes complicated in the structure and takes a long time in the maintenance and inspection thereof.

In order to avoid the above drawbacks of the conventional technique, electrostatic chuck utilizing static electricity is recently developed and widely adopted. However, this technique is indicated to have the following problems.

When the substrate is adsorbed and held by such an electrostatic chuck, charge retains between the substrate and the electrostatic chuck (through the action of adsorption force) even after the applied voltage is stopped, so that the detaching of the substrate can not be carried out unless the charge is completely removed.

For this end, it has been attempted to improve the insulating dielectric material used in the electrostatic chuck. For example, there are proposed ① JP-A-6-8089 . . . a sintered body of a mixture of aluminum nitride powder and titanium nitride powder or a spray-coated layer thereof is used as a high insulative material; ② JP-A-6-302677 . . . titanium oxide is applied onto the high insulative material and aluminum is applied thereto to contact with Si+SiC plate; ③ JP-Y-6-36583 . . . use of high insulative substance (aluminum oxide); ④ JP-A-4-304942, JP-A-5-235152, JP-A-6-8089 . . . use of aluminum oxide, aluminum nitride, zinc oxide, quartz, boron nitride, sialon and the like; ⑤ JP-A-62-94953, JP-A-2-206147, JP-A-3-147843, JP-A-3-204924 and the like . . . volume resistivity is lowered to improve static electricity by adding $TiO_2$ (titania) having a high dielectric constant to the high insulative material in case of further requiring a higher static electricity.

However, the conventional $Al_2O_3 \cdot TiO_2$ based (alumina-titania) spray-coated layer has the following problems to be solved.

(1) When $Al_2O_3$ mixed with $TiO_2$ is used as a spray-coated layer having an electrostatic adsorption performance, the volume resistivity is small and a slight current flows, so that it can be expected to improve the static electricity through Johonson-Larbec effect. However, $TiO_2$ (titania) is a semiconductive substance, so that the moving rate of electrical charge is slow and the responsibility (arrival time of saturated adsorption, adsorption disappearing time ) when the application of voltage is stopped is poor. This responsibility becomes more remarkable under low-temperature environment.

In order to render the value of volume resistivity into, for example, a practical state of $1 \times 10^9 \Omega \cdot cm$, it is necessary to add 25% by weight of titania. In the production process of semiconductors, the addition of a great amount of titania means the incorporation of impurity, which brings about the degradation of quality and results in the contamination of working environment.

Furthermore, when the temperature of the semiconductor wafer to be adsorbed is higher than room temperature, there is a high possibility that a large leak current is passed to break wafer circuit because the volume resistivity is too low.

(2) The $Al_2O_3 \cdot TiO_2$ based spray-coated layer is formed by a spraying process. In the resulting layer, however, the volume resistivity and adsorption force are largely scattered and also the productivity is low to bring about the rise of the cost.

(3) The $Al_2O_3 \cdot TiO_2$ based spray-coated layer is porous, so that the high surface finishing can not be conducted and the remaining adhesion of foreign matter is frequently caused. Furthermore, the adhesion property to the substrate is low, so that the coated layer is peeled off from the substrate under service condition, particularly thermal change.

SUMMARY OF THE INVENTION

It is an object of the invention to provide an electrostatic chuck member having a large volume resistivity, a small scattering thereof and a stable quality.

It is another object of the invention to provide an electrostatic chuck member having a strong adsorption force and an excellent responsibility (release property) in the stop of voltage application.

It is the other object of the invention to establish a technique of advantageously producing the electrostatic chuck member having the above properties with a high productivity.

The inventors have made various studies with respect to the electrostatic chuck member having the aforementioned problems, particularly the member having an $Al_2O_3 TiO_2$ based spray-coated layer formed on a substrate and have the following knowledge.

① The inventors have confirmed from experiments that the problem in the conventional $Al_2O_3 \cdot TiO_2$ based spray-coated layer results mainly from $TiO_2$ (titania). Further, it has been found that this cause can be overcome when $TiO_2$ is changed into a crystal form of $Ti_nO_{2n-1}$ (n=1–9). ② It has been found that the following methods are effective as a technique of surely providing the $Al_2O_3 \cdot TiO_2$ based spray-coated layer containing $Ti_nO_{2n-1}$ (n=1–9).

a. Method of spraying an $Al_2O_3 \cdot TiO_2$ material under an atmosphere having a low oxygen partial pressure to isolate oxygen from $TiO_2$ to change into $Ti_nO_{2n-1}$ (n=1–9).

In this way, $TiO_2$ is changed into $Ti_nO_{2n-1}$ (n=1–9), whereby the responsibility is improved and the scattering of the volume resistivity is small and also the duality and productivity are improved.

b. The spray-coated layer containing $Ti_nO_{2n-1}$ (n=1–9) is obtained by spraying in an atmosphere containing substantially no oxygen or an air atmosphere capable of controlling to a pressure lower than atmospheric pressure with a plasma containing hydrogen as a thermal source. In this point, when the spraying is carried out under a pressure lower than the atmospheric pressure, spraying particles flying in the thermal source has a strong impact force to the substrate because the resistance through gas is small, and hence the dense coated layer having a good adhesion force is formed. Moreover, the dense spray-coated layer is possible to be subjected to a high surface finishing and also has an effect of decreasing the scattering of volume resistivity.

c. When hydrogen gas having a strong reducing action is used in plasma as a spraying heat source, the change of $TiO_2$ into $Ti_nO_{2n-1}$ (n=1–9) rapidly proceeds and the function and mechanism of the above items a and b can more effectively be promoted.

The invention is based on the above knowledge and the main part and construction thereof are shown below.

(1) An electrostatic chuck member comprises a metal substrate, an undercoat of a metallic spray-coated layer formed thereon and an $Al_2O_3 \cdot TiO_2$ based spray-coated layer containing a $Ti_nO_{2n-1}$ (n=1–9) type compound formed thereon.

(2) In the electrostatic chuck member, a thickness of the metallic spray-coated layer is 30–150 μm and a thickness of the $Al_2O_3 \cdot TiO_2$ based spray-coated layer containing the $Ti_nO_{2n-1}$ (n=1–9) type compound is 50–500 μm.

(3) In the electrostatic chuck member, the $Al_2O_3 \cdot TiO_2$ based spray-coated layer containing the $Ti_nO_{2n-1}$ (n=1–9) type compound has a porosity of 0.4–3.0% and a surface roughness Ra of 0.1–2.0 μm.

(4) The $Al_2O_3 \cdot TiO_2$ based spray-coated layer containing the $Ti_nO_{2n-1}$ (n=1–9) type compound is provided at its surface with a seal-treated layer of an organic or inorganic silicon compound and has a volume resistivity of $1\times10^9$–$1\times10^{11}$ Ω·cm.

(5) The metallic spray-coated layer is a layer made from at least one starting substance selected from Ni, Al, Cr, Co, Mo and alloys containing at least one of these metals.

(6) The $Ti_nO_{2n-1}$ (n=1–9) type compound included in the $Al_2O_3 \cdot TiO_2$ based spray-coated layer is one or more compounds selected from the group consisting of $Ti_3O_5$, $Ti_2O_3$, TiO, $Ti_4O_7$, $Ti_5O_9$, $Ti_6O_{11}$, $Ti_8O_{15}$, $Ti_7O_{13}$ and $Ti_9O_{17}$.

The above electrostatic chuck member can be produced by adopting the following methods.

(7) A method of producing an electrostatic chuck member comprises subjecting a metal substrate to a blast treatment, forming an undercoat of a metallic spray-coated layer on a surface of the substrate, and applying an $Al_2O_3 \cdot TiO_2$ based ceramic spraying material containing 2–30 wt % of $TiO_2$ thereonto in Ar gas or air atmosphere adjusted to a pressure of 30–750 hPa through a plasma spraying process containing a hydrogen gas to form a top spray-coated layer in which a part or whole of $TiO_2$ in the spraying material is changed into a crystalline compound represented by $Ti_nO_{2n-1}$ (n=1–9).

(8) A method of producing an electrostatic chuck member comprises subjecting a metal substrate to a blast treatment, forming an undercoat of a metallic spray-coated layer on a surface of the substrate, applying an $Al_2O_3 \cdot TiO_2$ based ceramic spraying material containing 2–30 wt % of $TiO_2$ thereonto in Ar gas or air atmosphere adjusted to a pressure of 30–750 hPa through a plasma spraying process containing a hydrogen gas to form a top spray-coated layer in which a part or whole of $TiO_2$ in the spraying material is changed into a crystalline compound represented by $Ti_nO_{2n-1}$ (n=1–9) and thereafter finish-grinding the top spray-coated layer to a surface roughness Ra of 0.1–2.0 μm.

(9) A method of producing an electrostatic chuck member comprises subjecting a metal substrate to a blast treatment, forming an undercoat of a metallic spray-coated layer on a surface of the substrate, applying an $Al_2O_3 \cdot Ti \cdot O_2$ based ceramic spraying material containing 2–30 wt % of $TiO_2$ thereonto in Ar gas or air atmosphere adjusted to a pressure of 30–750 hPa through a plasma spraying process containing a hydrogen gas to form a top spray-coated layer in which a part or whole of $TiO_2$ in the spraying material is changed into a crystalline compound represented by $Ti_nO_{2n-1}$ (n=1–9) and thereafter finish-grinding the top spray-coated layer to a surface roughness Ra of 0.1–2.0 μm, and then subjecting the finish ground surface to a seal treatment with a silicon compound.

(10) The seal treatment is carried out by applying an organic or inorganic silicon compound to the surface of the top spray-coated layer and then heating at 120–250° C. for 1–5 hours.

DESCRIPTION OF THE PREFERRED EMBODIMENTS

Figure 1:
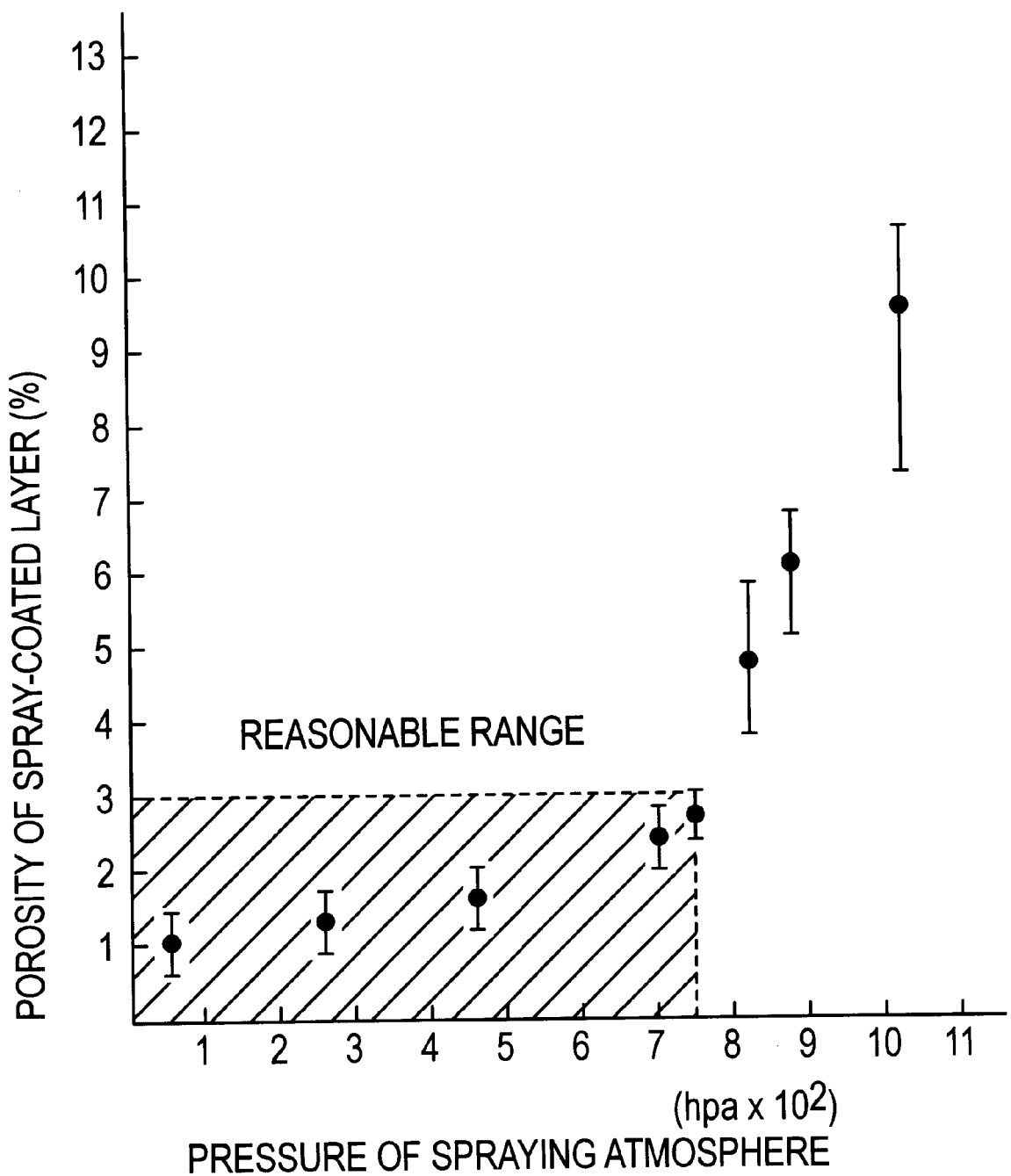
FIG. 1 is a graph showing a relation between atmosphere pressure in plasma spraying using an $Al_2O_3 \cdot TiO_2$ based ceramic spraying material and porosity of the resulting spray-coated layer.

An essential feature of the invention lies in that the component of the $Al_2O_3 \cdot TiO_2$ based spray-coated layer formed on the substrate includes a crystalline compound represented by $Ti_nO_{2n-1}$ (n=1–9).

The electrostatic chuck member according to the invention will be described in the order of the production steps together with the method of producing the $Al_2O_3 \cdot TiO_2$ based spray-coated layer and its function and mechanism.

(1) Formation of undercoat on metal substrate

In the electrostatic chuck member according to the invention, Al, Mo, W, C or the like is used as a substrate and then a surface of the metal substrate is uniformly roughened and cleaned by blowing $Al_2O_3$ particles (#60) thereonto.

Then, an undercoat of metallic spray-coated layer having a thickness of 30–150 μm is formed by spraying a metal of Ni, Al, Cr, Co, Mo or an alloy thereof as a spraying material through an arc spraying process or a plasma spraying process.

The action of the metallic spray-coated layer is based on the consideration of not only the adhesion force to the substrate but also the adhesion property to an $Al_2O_3 \cdot TiO_2$ based ceramic spray-coated layer subsequently formed as a topcoat. When the thickness of this layer is less than 30 $\mu$m, the function as the undercoat is low, while when it exceeds 150 $\mu$m, the remarkable effect is not obtained and the formation of the layer undesirably takes a long time.

(2) Formation of topcoat

After the formation of the metallic spray-coated layer as the $Al_2O_3 \cdot TiO_2$ based ceramic spray-coated layer is formed thereonto as a topcoat. The ceramic spray-coated layer will be described in detail below.

The spray-coated layer obtained by plasma spraying the commercially available $Al_2O_3 \cdot TiO_2$ based spraying material has strong peaks of $Al_2O_3$ and $TiO_2$ detected by an X-ray diffractometry, from which it is clear that the components of the spraying material are rendered into coated components as they are. However, the coated layer consisting of such crystalline components has problems that the response rate is slow and the leak current is large as mentioned above.

According to the invention, therefore, the same commercially available $Al_2O_3 \cdot TiO_2$ based ceramic spraying material is used and sprayed in an Ar gas atmosphere containing substantially no air (oxygen) or in an atmosphere containing a slight amount of air by using a hydrogen gas having a strong reducing action as a plasma working gas. In this case, it has been found that a part of $TiO_2$ releases oxygen to change into a crystalline compound represented by a general formula of $Ti_nO_{2n-1}$ (n=1–9).

The reason why $TiO_2$ releases oxygen to produce $Ti_nO_{2n-1}$ (n=1–9) compound when the $Al_2O_3 \cdot TiO_2$ based ceramic spraying material is plasma-sprayed using hydrogen gas is considered due to the fact that Ar, He, $H_2$ or the like is isolated into ion and electron in the plasma as a spraying heat source to form a region being electrically neutral as a whole of the plasma but having locally a high electron density, while $TiO_2$ spraying particles pass through this region to release oxygen and change into the form of the $Ti_nO_{2n-1}$ (n=1–9) compound.

This phenomenon becomes more conspicuous when the plasma spraying is carried out under a condition that the spraying atmosphere contains hydrogen but does not contain oxygen.

According to the inventors' experiments, $Ti_3O_5$, $Ti_2O_3$, TiO, $Ti_4O_7$, $Ti_5O_9$, $Ti_6O_{11}$, $Ti_8O_{15}$, $Ti_7O_{13}$, $Ti_9O_{17}$ and $Ti_{10}O_{19}$ are found as the $Ti_nO_{2n-1}$ (n=1–9) compound. Among them, $Ti_3O_5$ and $Ti_2O_3$ are effective.

In the formation of the $Al_2O_3 \cdot TiO_2$ based ceramic spray-coated layer containing $Ti_nO_{2n-1}$ (n=1–9) as the topcoat according to the invention, when the layer is formed in an atmosphere containing no oxygen under a pressure lower than atmospheric pressure, resistance of gas to the spraying particles flying in the heat source reduces, so that the impact energy of the spraying particles to the substrate becomes large and the deposition density of the particles becomes large accompanied therewith and hence the porosity of the coated layer becomes considerably small. It can be said that this method is suitable.

For example, FIG. 1 shows a relation between porosity of plasma spray-coated layer obtained by using commercially available 85 wt % $Al_2O_3$–15 wt % $TiO_2$ spraying material and pressure of spraying atmosphere. As seen from this result, the porosity of the coated layer becomes smaller under a lower pressure.

Since the topcoat of the spray-coated layer according to the invention is required to have a porosity of not more than 3%, the spraying atmosphere pressure satisfying the above condition is not more than 750 hPa as seen from the above figure.

Because, the $Al_2O_3 \cdot TiO_2$ based ceramic spray-coated layer containing $Ti_nO_{2n-1}$ (n=1–9) and having a porosity or not more than 3% develops properties suitable as a coating for the electrostatic chuck, i.e. the scattering of volume resistivity is low, the highly surface finishing is possible and the like. Particularly, the coated layer having a porosity of more than 3% has drawbacks that the scattering of volume resistivity is large to increase the reject ratio, the smoothly polished finish surface is not obtained and the like.

In the ceramic spray-coated layer according to the invention, the average surface roughness Ra is required to be within a range of 0.1–2.0 $\mu$m. Preferably, it is within a range of 0.1–1.0 $\mu$m. When the finish surface has Ra: less than 0.1 $\mu$m, the number of polishing steps is uneconomically large and the residual adsorption force to the wafer is large. When the surface roughness Ra exceeds 2.0 $\mu$m, the scattering of volume resistivity becomes large and the inaccuracy of fixing silicon wafer becomes undesirably large in the use as the electrostatic chuck.

The amount of $TiO_2$ included in the $Al_2O_3 \cdot TiO_2$ based ceramic spray-coated layer according to the invention is 2–30 wt %, preferably 5–15 wt %. When the $TiO_2$ amount is less than 2 wt %, the value of the volume resistivity of the spray-coated layer is too high, while when it exceeds 30 wt %, the -value of the volume resistivity is too low and a large leak current undesirably flows.

Moreover, the thickness of the topcoat is within a range of 50–500 $\mu$m, preferably 100–300 $\mu$m. When the thickness is less than 50 $\mu$m, the function as the topcoat is not sufficiently developed and the dielectric strength is unsuitably low. When it exceeds 500 $\mu$m, a long time is taken in the formation to degrade the productivity and also the peeling is apt to be caused by thermal shock.

(3) Sealing treatment or polished surface

If necessary, an organic silicon compound (commercially available organic silicone resin) or an inorganic silicon compound (commercially available silicon alkoxide compound) is applied to the $Al_2O_3 \cdot TiO_2$ based ceramic spray-coated layer containing $Ti_nO_{2n-1}$ (n=1–9) compound and having a given polished roughness according to the invention and then heated to 120–350° C. for 1–5 hours.

This procedure is to prevent the retaining adhesion of foreign matter by filling the silicon compound in the fine porous portions of the spray-coated layer.

In general, the porosity of the $Al_2O_3 \cdot TiO_2$ based ceramic spray-coated layer containing $Ti_nO_{2n-1}$ (n=1–9) compound according to the invention is as very low as not more than 3%, so that the sealing treatment is not an essential step. However, the sealing treatment is said to be preferable because the sealed surface prevents the adhesion of foreign matter in the industrial use as the electrostatic chuck.

The following examples are given in illustration of the invention and are not intended as limitations thereof.

EXAMPLE 1

In this example, the influence of kind of atmosphere gas and thickness upon the state of forming $Ti_nO_{2n-1}$ (n=1–9) in the spray-coated layer is examined in% the plasma spraying of $Al_2O_3TiO_2$ based spraying material.

(1) Substrate to be used:

Pure aluminum plate (size: width 50 mm×length 100 mm×thickness 8 mm)

(2) Undercoat of spray-coated layer:

it is formed at a thickness of 100 μm by plasma spraying process of 90 wt %Ni–10 wt %.Al in air.

(3) Topcoat of spray-coated layer:

It is formed on the undercoat at a thickness of 300 μm by using $Al_2O_3 \cdot 15$ wt %$TiO_2$ spraying material through plasma spraying process under various pressures and various kinds of atmosphere.

(4) Spraying atmosphere and pressure:

① Ar gas: 30–1000 hPa

② Air: 30–1000 hPa (5) Plasma working gas:

A mixed gas of Ar and $H_2$ is used.

(6) Evaluation method:

Each cut section of the spray-coated layers formed under the above conditions is observed by means of an optical microscope to measure a porosity, while a part of the coated layer is taken out and placed in an X-ray diffraction device to measure a change of $TiO_2$ crystal system.

(7) Test results:

The results are shown in Table 1. As seen from the results of Table 1, the porosity of the coated layer is within a range of 0.4–3.0% under conditions of 30–750 hPa in atmospheres of Ar and air and a part of $TiO_2$ in 90 wt %Ni–10 wt %Al constituting the coated layer changes into $Ti_3O_5$, $Ti_2O_3$ and other $Ti_nO_{2n-1}$ type crystal system. Particularly, the peck of $TiO_2$ disappears substantially completely in Ar atmosphere under 30–200 hPa (Test Nos. 1 and 2), and a great part thereof changes into $Ti_nO_{2n-1}$ (n=1–9) type having a less oxygen amount.

(4) Spraying atmosphere and pressure:

Ar gas: 60, 200, 750, 900, 1000 hPa (5) Plasma working gas: same as in Example 1

(6) Evaluation method:

The coated layer prepared by the above procedure is polished to render into a mirror surface as far as possible, which is heated in air at 300° C. for 10 minutes and cooled in air to room temperature and this procedure is repeated 10 times to measure a change of appearance of the coated layer (average roughness Ra).

Moreover, this test is conducted with respect to the coated layer in which a silicon alkoxyde compound is applied three times and subjected to a driving treatment at 200° C. for 30 minutes to measure the effect.

(7) Test results:

The results are shown in Table 2. As seen from Table 2, the coated layer formed by spraying under a low pressure (60–750 hPa) is small in the porosity and smooth in the finish polished surface. However, when the spraying pressure is 900 hPa or 1000 hPa, the smooth polished surface is not obtained. Because, it is considered that the coated layer formed under a low pressure (30–750 hPa) has a polished surface having Ra: 0.1–2.5 μm owing to the low porosity, while in the coated layer having a high porosity (900–1000 hPa), the porous portion is exposed in form of pit and hence the surface roughness is necessarily large.

On the other hand, the thermal shock resistances of these coated layers develop relatively good properties under this test conditions independently of the presence or absence of the sealing agent. Only in the coated layers (Nos. 4 and 5)

TABLE 1

| No. | Spraying atmosphere Kind of gas | Pressure (hPa) | Porosity of coated layer (%) | Results of X-ray diffraction TiO$_2$ | Ti$_3$O$_5$ | Ti$_2$O$_3$ | another Ti$_n$O$_{2n-1}$ | Remarks |
|---|---|---|---|---|---|---|---|---|
| 1 | Ar | 30 | 0.4~1.5 | not detected | ○ | ⊙ | ○ | Acceptable Example |
| 2 |  | 200 | 0.8~1.7 | not detected | ⊙ | ⊙ | ○ |  |
| 3 |  | 600 | 1.5~2.1 | Δ | ⊙ | ○ | ○ |  |
| 4 |  | 750 | 2.4~3.0 | ○ | ⊙ | ○ | ○ |  |
| 5 |  | 900 | 3.8~5.8 | ○ | ⊙ | ○ | ○ | Comparative |
| 6 |  | 1000 | 7.5~10.5 | ○ | ⊙ | ○ | ○ | Example |
| 7 | Air | 30 | 0.6~1.8 | ○ | ⊙ | ○ | ○ | Acceptable |
| 8 |  | 200 | 1.0~1.7 | ○ | ⊙ | ○ | ○ | Example |
| 9 |  | 600 | 1.7~2.3 | ○ | ⊙ | ○ | ○ |  |
| 10 |  | 750 | 2.6~3.0 | ○ | ⊙ | ○ | ○ |  |
| 11 |  | 900 | 4.0~6.8 | ⊙ | — | — | Δ | Comparative |
| 12 |  | 1000 | 8.5~13.0 | ⊙ | — | — | Δ | Example |

(Note)
(1) use of Ar/H$_2$ mixed gas as a plasma gas
(2) Ti$_n$O$_{2n-1}$ compound is a compound of n = 4–9.
(3) Symbol in column of X-ray diffraction result as follows: ⊙: strongest diffraction peak, ○: strong peak, Δ: weak peak, —: hardly observed

EXAMPLE 2

In this example, a limit of finish polishing is measured by using the same coated layer as in Example 1, while a thermal shock test is made to measure an adhesion property of the coated layer and a mechanical resistance through thermal shock.

(1) Substrate to be used: same as in Example 1

(2) Undercoat of spray-coated layer: same as in Example 1

(3) Topcoat of spray-coated layer: same as in Example 1 containing no sealing agent, the occurrence of slight cracking is observed after the repetition of the test 8 times.

From the above results, it has been confirmed that the smooth polishing is possible because the coated layer according to the invention is dense, and the resistance to thermal shock is good under the conditions in this example irrespectively of the sealing agent.

TABLE 2

| No. | Spraying atmosphere Pressure (hpa) | Properties coated layer Porosity (%) | Surface roughness Ra (μm) | Sealing treatment | Results of thermal shock test | Remarks |
|---|---|---|---|---|---|---|
| 1 | 60 | 0.5~1.5 | 0.1~0.3 | absence | no cracking after 10 times | Acceptable Example |
| 2 | 200 | 0.8~1.7 | 0.3~0.5 | | | |
| 3 | 750 | 2.4~3.0 | 0.8~2.5 | | | |
| 4 | 900 | 3.8~5.8 | 3.2~3.5 | | Occurrence of slight cracking at 8 times | Comparative Example |
| 5 | 1000 | 7.5~10.5 | 3.2~4.1 | | | |
| 6 | 60 | 0.5~1.5 | 0.1~0.3 | presence | no cracking after 10 times | Acceptable Example |
| 7 | 200 | 0.8~1.7 | 0.3~0.5 | | | |
| 8 | 750 | 2.4~3.0 | 0.8~2.5 | | | |
| 9 | 900 | 3.8~5.8 | 3.2~3.5 | | | Comparative Example |
| 10 | 1000 | 7.5~10.5 | 3.2~4.1 | | | |

(Note)
(1) Ar/H$_2$ mixed gas is used as a plasma gas.
(2) Crystal type of coated layer is the same as in Table 1.
(3) Conditions of thermal shock test are 10 times repetition of 300° C. × 15 minutes ⇆ room temperature.

EXAMPLE 3

A volume resistivity of the Al$_2$O$_3$·TiO$_2$ based ceramic spray-coated layer according to the invention is measured, and the scattering thereof is compared with that obtained by the conventional spraying process.

(1) Substrate to be used: same as in Example 1
(2) Undercoat of spray-coated layer: same as in example 1
(3) Topcoat of spray-coated layer:

It is formed at a thickness of 250 μm or 500 μm by using Al$_2$O$_3$–14 wt %TiO$_2$ material through plasma spraying process under various pressures and various gas atmospheres.

(4) Spraying atmosphere and pressure:
① Ar gas: 60, 750, 1000 hPa
② Air: 60, 750, 1000 hPa
(5) Plasma working gas: use of Ar/H$_2$ mixed gas
(6) Evaluation method:

A dotite (Ag paste) is applied onto the surface of the spray-coated layer as an electrode and a direct current of 500V is applied between the dotite and the aluminum substrate to measure a resistivity, from which a volume resistivity is calculated according to the following equation.

Volume resistivity $\rho = RA/d$ (ω·cm)

A: electrode area (cm$^2$) d: coated layer thickness (cm) R: resistivity (ω)

The measurement is 5 positions every one coated layer, and also the effect of sealing treatment with a silicon alkoxyde compound (200° C.×30 minutes drying after the application, 3 times repeat) is examined.

(7) Test results:

The results are shown in Table 3. As seen from the results of Table 3, the comparative spray-coated layers (Nos. 5, 6, 11, 12) formed under air or Ar spraying atmosphere of 1000 hPa are large in the scattering of volume resistivity and the effect of the sealing treatment is not clear.

In the coated layers according to the invention (Nos. 1–4, 7–10), the porosity is small and the property is dense and a part of TiO$_2$ in the spraying material changes into Ti$_n$O$_{2n-1}$ (n=1–9), so that the scattering of the measured value is less and the value of volume resistivity required in the electrostatic chuck according to the invention is within a range of $1 \times 10^9$–$10^{11}$ ω·cm and it is confirmed that the quality control is very easy.

TABLE 3

| No. | Spraying atmosphere Kind of gas | Pressure (hPa) | Properties of spray-coated layer thickness (μm) | Porosity (%) | Ti$_n$O$_{2n-1}$ | reality treatment | Volume resistivity (Ω·cm$^2$) | Remark |
|---|---|---|---|---|---|---|---|---|
| 1 | Ar | 60 | 250 | 0.5~1.5 | presence | presence | $1 \times 10^{10}$~$10^{11}$ | Acceptable Example |
| 2 | | 60 | 500 | 0.5~1.4 | presence | absence | $1 \times 10^{10}$~$10^{11}$ | |
| 3 | | 750 | 250 | 2.4~3.0 | presence | presence | $1 \times 10^9$~$10^{11}$ | |
| 4 | | 750 | 500 | 2.2~2.8 | presence | absence | $1 \times 10^9$~$10^{11}$ | |
| 5 | | 1000 | 250 | 7.5~10.5 | absence | presence | $1 \times 10^7$~$10^{13}$ | Comparative Example |
| 6 | | 1000 | 500 | 7.2~10.8 | absence | absence | $1 \times 10^7$~$10^{12}$ | |
| 7 | Air | 60 | 250 | 0.5~1.6 | presence | presence | $1 \times 10^{10}$~$10^{11}$ | Acceptable Example |
| 8 | | 60 | 500 | 0.5~1.5 | presence | absence | $1 \times 10^{10}$~$10^{11}$ | |
| 9 | | 750 | 250 | 2.3~3.0 | presence | presence | $1 \times 10^9$~$10^{11}$ | |

TABLE 3-continued

| | Spraying atmosphere | | Properties of spray-coated layer | | | | | |
|---|---|---|---|---|---|---|---|---|
| No. | Kind of gas | Pressure (hPa) | thickness (μm) | Porosity (%) | $Ti_nO_{2n-1}$ | reality treatment | Volume resistivity (Ω·cm$^2$) | Remark |
| 10 | | 750 | 500 | 2.4~3.0 | presence | absence | $1 \times 10^9$~$10^{11}$ | |
| 11 | | 1000 | 250 | 7.8~11.5 | absence | presence | $1 \times 10^7$~$10^{13}$ | Comparative |
| 12 | | 1000 | 500 | 7.9~12.0 | absence | absence | $1 \times 10^6$~$10^{12}$ | Example |

(Note)
(1) Ti3O5, Ti2O3 and other TinO2n-1 (n = 4–9) are included in TinO2n-1.
(2) The sealing treatment is a treatment that drying of 200° C. x 30 minutes is repeated 3 times after the application of silicon alkoxyde compound.

EXAMPLE 4

The adsorption force to silicon wafer and the decaying rate of residual adsorption force are measured in the electrostatic chuck provided with the $Al_2O_3 \cdot TiO_2$ based ceramic spray-coated layer according to the invention.

(1) Electrostatic chuck substrate:

A disc-like aluminum alloy having a thickness of 40 mm and a diameter of 200 mm is used as a substrate and blasted with alumina, and an undercoat of 90 wt %Ni–10 wt %Al is formed thereon at a thickness of 100 μm through plasma spraying process in air. Thereafter, $Al_2O_3$ 8 wt %$TiO_2$ spray-coated layer is formed on the undercoat at a thickness of 300 μm in the same manner as in Example 1. Then, polymethylsiloxane polymer is applied and subjected to a sealing treatment at 250° C. for 1 hour.

Moreover, $Al_2O_3 \cdot 8$ wt %$TiO_2$ is formed at a thickness of 300 μm in air as a comparative example.

Figure 2:
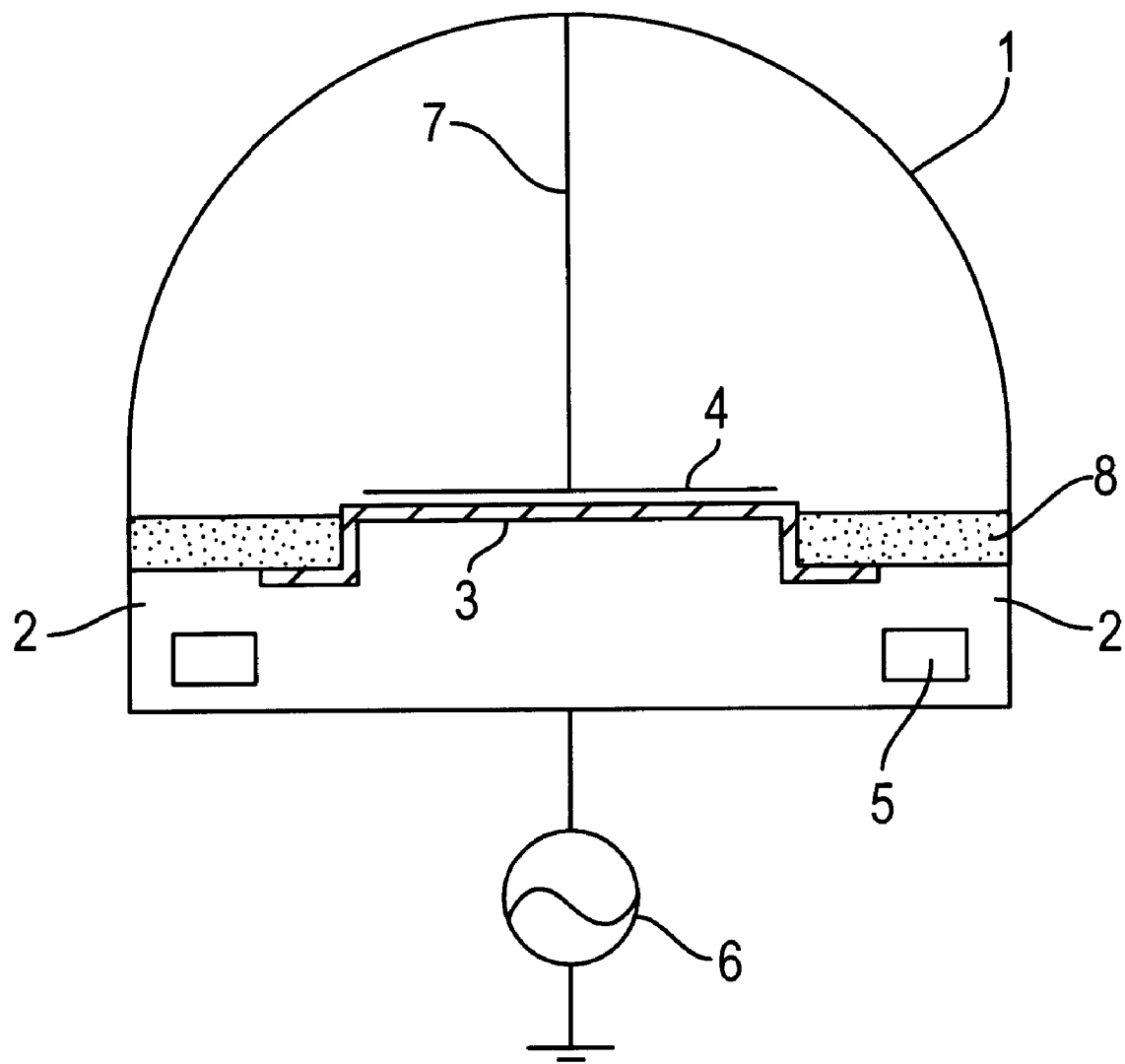
FIG. 2 is a diagrammatic outline of an apparatus for measuring a volume resistivity of an electrostatic chuck member provided with an $Al_2O_3 \cdot TiO_2$ based spray-coated layer formed through plasma spraying process.

(2) Evaluation method:

FIG. 2 shows an outline or an apparatus of measuring the adsorption force to silicon wafer and the decaying rate of residual adsorption force in the spray-coated layer according to the invention. This apparatus comprised a vacuum vessel 1, a spray-coated layer 3 fixed to a central portion of the vessel through an electrostatic chuck substrate 2 of aluminum alloy, and a silicon wafer 4 statically placed on the spray-coated layer 3. Further, the electrostatic chuck substrate 2 is provided with a hole 5 flowing a refrigerant for cooling and connected to a power source 6 located outside the vacuum vessel 1. Moreover, a ground line 7 is attached to the silicon wafer, while an insulative ceramics 8 is arranged on an upper half portion of the electrostatic chuck.

(3) Test results:

The electrostatic adsorption force to silicon wafer in the application of voltage and the decaying state of residual adsorption force after the stop of voltage application are shown in Table 4.

As seen from the results of Table 4, the adsorption force of the comparative spray-coated layer 24–30 gf/cm$^2$ at an applied voltage of 250V and 30–150 gf/cm$^2$ at an applied voltage, while the spray-coated layer according to the invention exhibits adsorption forces of about 100 gf/cm$^2$ at the former voltage and 300–350 gf/cm$^2$ at the latter voltage, respectively.

As to the decaying rate of adsorption force, the residence of 3–10 gf/cm$^2$ is observed in the spray-coated layer of the comparative example even after the 60 seconds of voltage cut, while the adsorption force completely disappears within 1 second after the voltage cut in the spray-coated layer according to the invention.

TABLE 4

| | Spraying atmosphere | | | | Electrostatic absorption force (gf/cm$^2$) | | Residual absorption force (gf/cm$^2$) | | |
|---|---|---|---|---|---|---|---|---|---|
| No. | Kind of gas | Pressure (hPa) | $Ti_nO_{2n-1}$ | Sealing treatment | 250 V | 500 V | after 1 second | after 60 seconds | Remarks |
| 1 | Ar | 60 | presence | presence | 95~103 | 300~350 | 0 | — | Acceptable |
| 2 | | 60 | presence | absence | 98~105 | 305~345 | 0 | — | Example |
| 3 | | 750 | presence | presence | 95~102 | 300~348 | 0 | — | |
| 4 | | 750 | presence | absence | 97~106 | 304~350 | 0 | — | |
| 5 | Air | 60 | presence | presence | 96~102 | 302~345 | 0 | — | |
| 6 | | 60 | presence | absence | 95~101 | 305~335 | 0 | — | |
| 7 | | 750 | presence | presence | 90~100 | 310~330 | 0 | — | |
| 8 | | 750 | presence | absence | 92~100 | 302~331 | 0 | — | |
| 9 | Air | 1005 | absence | presence | 5~8 | 25~30 | 5~23 | 3~10 | Comparative |
| 10 | | 1005 | absence | absence | 5~7 | 24~28 | 4~24 | 4~8 | Example |

(Note)
(1) Titanium oxides capable of being represented by $Ti_3O_5$, $Ti_2O_3$ and other $Ti_nO_{2n-1}$ (n = 4–9) are included in $Ti_nO_{2n-1}$.
(2) The sealing treatment is a heating of 200° C. x 30 minutes after the application of polymethylsiloxane polymer.

EXAMPLE 5

In this example, the adhesion property of the $Al_2O_3 \cdot TiO_2$ based ceramic spray-coated layer according to the invention is examined in the presence or absence of the undercoat of the spray-coated layer.

(1) Substrate to be used:

A commercially available material of Al, Mo or W is cut into a substrate of width 50 mm×length 100 mm×thickness 8 mm.

(2) Undercoat:

it is formed on the substrate at a thickness of 30, 100 or 150 µm by using the same spraying material as in Example 1 through plasma spraying process in air.

(3) Topcoat:

It is formed at a thickness of 300 µm by using the same spraying material as in Example 1 and a mixed plasma frame of hydrogen gas and Ar gas in Ar of 60 hPa.

Moreover, the topcoat is directly formed on the substrate without the formation of the undercoat as a comparative example.

(4) Evaluation method:

After the test specimen of the above coated layer is heated in air at 300° C. for 10 minutes and cooled by blowing air of room temperature, this procedure is repeated 10 times to measure the presence or absence of cracking and peeling in the topcoat of the spray-coated layer.

(5) Test results:

The results are shown in Table 5. As seen from Table 5, the occurrence of cracking is caused in the topcoats having no undercoat (Nos. 10, 11, 12) by repeating thermal shock test 2–3 times irrespectively of the kind of the substrate material, and also 30–50% of the coated layer is peeled off.

On the contrary, the topcoats having the undercoat according to the invention (Nos. 1–9) exhibit good adhesion property irrespectively of the kind of the substrate material and have no problem even after the repetition of thermal shock test 10 times.

TABLE 5

| No. | Substrate material | Thickness of undercoat (µm) | Thickness of topcoat (µm) | Result of thermal shock test | Remarks |
|---|---|---|---|---|---|
| 1 | Al | 30 | 300 | no cracking after 10 times | Acceptable Example |
| 2 |   | 100 | 300 |   |   |
| 3 |   | 150 | 300 |   |   |
| 4 | Mo | 30 | 300 |   |   |
| 5 |   | 100 | 300 |   |   |
| 6 |   | 150 | 300 |   |   |
| 7 | W | 30 | 300 |   |   |
| 8 |   | 100 | 300 |   |   |
| 9 |   | 150 | 300 |   |   |
| 10 | Al | none | 300 | peeling at 2 times | Comparative Example |
| 11 | Mo | none | 300 | peeling at 3 times |   |
| 12 | W | none | 30 | peeling at 3 times |   |

(Note)
(1) A spraying material for the undercoat is 90 wt % Ni-10 wt % Al.
(2) A spraying material for the topcoat is $Al_2O_3$-15 wt % $TiO_2$.

As seen from the above, the ceramic spray-coated layer in which a part or whole of $TiO_2$ coexisting with $Al_2O_3$ is changed into a crystalline compound represented by a general formula of $Ti_nO_{2n-1}$ (n=1–9) according to the invention is strong in the adsorption force to silicon wafer or the like, fast in the decaying rate of residual adsorption force and is very excellent in the basic properties as an electrostatic chuck. Furthermore, the adhesion properties of the undercoat to the substrate and the topcoat to the undercoat and the denseness are excellent and the quality is stable.

Moreover, the scattering of volume resistivity is small, so that the quality control is easy and the productivity is high. Therefore, the invention largely contributes to the development of industrial fields using the electrostatic chuck.

What is claimed is:

1. An electrostatic chuck member comprising:
   a metal substrate;
   an undercoat of a metallic spray-coated layer formed on the metal substrate; and
   an $Al_2O_3 \cdot TiO_2$ based spray-coated layer formed by spraying an $Al_2O_3 \cdot TiO_2$ based ceramic material comprising 2–30 wt % of $TiO_2$ on the metallic spray-coated layer such that at least a portion of the $TiO_2$ is changed into at least one $TiO_2n_{-1}$, where n=1 to 9, compound.

2. The electrostatic chuck member according to claim 1, wherein a thickness of the metallic spray-coated layer is 30–150 µm and a thickness of the $Al_2O_3 \cdot TiO_2$ based spray-coated layer comprising the at least one $Ti_nO_{2n-1}$ compound is 50–500 µm.

3. The electrostatic chuck member according to claim 1, wherein the $Al_2O_3 \cdot TiO_2$ based spray-coated layer comprising the at least one $Ti_nO_{2n-1}$ compound has a porosity of 0.4–3.0% and a surface roughness Ra of 0.1–2.0 µm.

4. The electrostatic chuck member according to claim 1, further comprising a seal-treated layer of one of an organic silicon compound and an inorganic silicon compound on a surface of the $Al_2O_3 \cdot TiO_2$ based spray-coated layer comprising the at least one $Ti_nO_{2n-1}$ compound, and wherein the $Al_2O_3 \cdot TiO_2$ based spray-coated layer comprising the at least one $Ti_nO_{2n-1}$ compound has a volume resistivity of $1 \times 10^9$–$1 \times 10^{11}$ ω·cm.

5. The electrostatic chuck member according to claim 1, wherein the metallic spray-coated layer is a layer made from at least one starting substance selected from the group consisting of Ni, Al, Cr, Co, Mo, and alloys thereof.

6. The electrostatic chuck member according to claim 1, wherein the at least one $Ti_nO_{2n-1}$ compound included in the $Al_2O_3 \cdot TiO_2$ based spray-coated layer is at least one compound selected from the group consisting of $Ti_3O_5$, $Ti_2O_3$, TiO, $Ti_4O_7$, $Ti_5O_9$, $Ti_6O_{11}$, $Ti_8O_{15}$, $Ti_7O_{13}$, and $Ti_9O_{17}$.

7. A method of producing an electrostatic chuck member, which comprises:
   subjecting a metal substrate to a blast treatment;
   forming an undercoat of a metallic spray-coated layer on a surface of the substrates and applying an $Al_2O_3$ $TiO_2$ based ceramic spraying material comprising 2–30 wt % of $TiO_2$ on the metallic spray-coated layer in Ar gas or air atmosphere adjusted to a pressure of 30–750 hPa through a plasma spraying process using hydrogen gas to form a top spray-coated layer in which one of a part and a whole of $TiO_2$ in the spraying material is changed into at least one $Ti_nO_{2n-1}$ crystalline compound.

8. A method of producing an electrostatic chuck member, which comprises:
   subjecting a metal substrate to a blast treatment;
   forming an undercoat of a metallic spray-coated layer on a surface of the substrate;
   applying an $Al_2O_3 \cdot TiO_2$ based ceramic spraying material comprising 2–30 wt % of $TiO_2$ on the metallic spray-coated layer in Ar gas or air atmosphere adjusted to a pressure of 30–750 hPa through a plasma spraying process using hydrogen gas to form a top spray-coated layer in which one of a part and a whole of $TiO_2$ in the spraying material is changed into at least one $Ti_nO_{2n-1}$ crystalline compound; and thereafter finish-grinding the top spray-coated layer to a surface roughness Ra of 0.1–2.0 µm.

9. A method of producing an electrostatic chuck member, which comprises:

subjecting a metal substrate to a blast treatment;

forming an undercoat of a metallic spray-coated layer on a surface of the substrate;

applying an $Al_2O_3 \cdot TiO_2$ based ceramic spraying material comprising 2–30 wt % of $TiO_2$ on the metallic spray-coated layer in Ar gas or air atmosphere adjusted to a pressure of 30–750 hPa through a plasma spraying process using hydrogen gas to form a top spray-coated layer in which one of a part and a whole of $TiO_2$ in the spraying material is changed into at least one $Ti_nO_{2n-1}$ crystalline compound;

thereafter finish-grinding the top spray-coated layer to a surface roughness Ra of 0.1–2.0 µm; and then subjecting the finish ground surface to a seal treatment with a silicon compound.

10. The method according to claim 9, wherein the seal treatment is carried out by applying an organic or inorganic silicon compound to the surface of the top spray-coated layer and then heating at 120–350° C. for 1–5 hours.

11. An electrostatic chuck member comprising:

a metal substrate;

an undercoat of a metallic spray-coated layer formed on the metal substrate; and an $Al_2O_3 \cdot TiO_2$ based spray-coated layer comprising at least one $Ti_nO_{2n-1}$ where n=1 to 9, compound formed on the metallic spray-coated layer.

12. The electrostatic chuck member according to claim 11, wherein a thickness of the metallic spray-coated layer is 30–150 µm and a thickness of the $Al_2O_3$ $TiO_2$ based spray-coated layer comprising the at least one $Ti_nO_{2n-1}$ compound is 50–500 µm.

13. The electrostatic chuck member according to claim 11, wherein the $Al_2O_3 \cdot TiO_2$ based spray-coated layer comprising the at least one $Ti_nO_{2n-1}$ compound has a porosity of 0.4–3.0% and a surface roughness Ra of 0.1–2.0 µm.

14. The electrostatic chuck member according to claim 11, further comprising a seal-treated layer of one of an organic silicon compound and an inorganic silicon compound on a surface of the $Al_2O_3 \cdot TiO_2$ based spray-coated layer comprising the at least one $Ti_nO_{2n-1}$ compound, and wherein the $Al_2O_3 \cdot TiO_2$ based spray-coated layer comprising the at least one $Ti_nO_{2n-1}$ compound has a volume resistivity of $1 \times 10^9 - 1 \times 10^{11}$ ω·cm.

15. The electrostatic chuck member according to claim 11, wherein the metallic spray-coated layer is a layer made from at least one starting material selected from the group consisting of Ni, Al, Cr, Co, Mo, and alloys thereof.

16. A method of producing an electrostatic chuck member, comprising:

subjecting a metal substrate to a blast treatment;

spray-coating a metallic undercoat on a surface of the metal substrate; and spray-coating $Al_2O_3 \cdot TiO_2$ on to the metallic undercoat to form a $Al_2O_3 \cdot TiO_2$ based layer in which at least a portion of the $TiO_2$ is changed into $Ti_nO_{2n-1}$, where n=1–9.

17. The method according to claim 16, wherein the spray-coating of the $Al_2O_3 \cdot TiO_2$ comprises plasma spraying hydrogen gas and $Al_2O_3 \cdot TiO_2$ in one of Ar gas and air atmosphere at a pressure of 30–750 hPa.

18. The method according to claim 16, further comprising finish-grinding the $Al_2O_3$ $TiO_2$ based layer to a surface roughness Ra of 0.1–2.0 µm.

19. The method according to claim 18, further comprising subjecting the finish ground surface to a seal treatment with a silicon compound.

20. The method according to claim 19, wherein the seal treatment comprises applying one of an organic silicon compound and an inorganic silicon compound to the finish ground surface and then heating at 120–350° C. for 1–5 hours.

* * * * *

UNITED STATES PATENT AND TRADEMARK OFFICE
CERTIFICATE OF CORRECTION

PATENT NO. : 5,909,354
DATED : June 1, 1999
INVENTOR(S) : Y. HARADA et al.

Page 1 of 2

It is certified that error appears in the above-identified patent and that said Letters Patent is hereby corrected as shown below:

On the printed patent cover, at paragraph [56], References Cited, Foreign Patent Documents, the following was omitted and should be inserted --- 6-36583 9/94 Japan ---.

On the printed patent cover, at paragraph [56], References Cited, Other Publications, the following was omitted and should be inserted --- English Language Abstract of JP-3-147843 ---.

On the printed patent cover, at line 3, paragraph [57], Abstract, "$Al_2O_3TiO_2$" should be --- $Al_2O_3 \cdot TiO_2$ ---.

On the printed patent cover, at line 9, paragraph [57], Abstract, "$Al_2O_3TiO_2$" should be --- $Al_2O_3 \cdot TiO_2$ ---.

On the printed patent cover, at line 10, paragraph [57], Abstract, "$Al_2O_3TiO_2$" should be --- $Al_2O_3 \cdot TiO_2$ ---.

On the printed patent cover, at line 12, paragraph [57], Abstract, "$Ti_nO_2$" should be --- $Ti_nO_{2n-1}$ ---.

At column 14, line 15 (claim 1, line 9) , "$TiO_{2n-1}$" should be --- $Ti_nO_{2n-1}$ ---.

At column 14, line 31 (claim 4, line 6) "$Al_2O_3TiO_2$" should be --- $Al_2O_3 \cdot TiO_2$ ---.

UNITED STATES PATENT AND TRADEMARK OFFICE
CERTIFICATE OF CORRECTION

PATENT NO. : 5,909,354
DATED : June 1, 1999
INVENTOR(S) : Y. HARADA et al.

It is certified that error appears in the above-identified patent and that said Letters Patent is hereby corrected as shown below:

At column 14, line 33 (claim 4, line 8) of the printed patent, "$\omega \cdot cm$" should be -- $\Omega \cdot cm$ --.

At column 14, line 47 (claim 7, line 5) of the printed patent, "substrates" should be -- substrate; --.

At column 14, line 47 (claim 7, line 5) of the printed patent, "$Al_2O_3TiO_2$" should be -- $Al_2O_3 \cdot TiO_2$ --.

At column 15, line 34 (claim 12, line 3) of the printed patent, "$Al_2O_3TiO_2$" should be -- $Al_2O_3 \cdot TiO_2$ --.

At column 16, line 8 (claim 14, line 8) of the printed patent, "$\omega \cdot cm$" should be -- $\Omega \cdot cm$ --.

At column 16, line 29 (claim 18, line 2) of the printed patent, "$Al_2O_3TiO_2$" should be -- $Al_2O_3 \cdot TiO_2$ --.

Signed and Sealed this

Fifteenth Day of February, 2000

Attest:

Q. TODD DICKINSON

*Attesting Officer*     *Commissioner of Patents and Trademarks*